United States Patent [19]
McClure

[11] Patent Number: 5,583,816
[45] Date of Patent: Dec. 10, 1996

[54] LONG WRITE TEST

[75] Inventor: David C. McClure, Carrollton, Tex.

[73] Assignee: SGS-Thomson Microelectronics, Inc., Carrollton, Tex.

[21] Appl. No.: 267,667

[22] Filed: Jun. 29, 1994

[51] Int. Cl.$^6$ ............................................... G11C 7/00
[52] U.S. Cl. ........................... 365/201; 365/230.06
[58] Field of Search ................................. 365/201, 154, 365/156, 230.03, 203, 230.06

[56] References Cited

U.S. PATENT DOCUMENTS

| | | | |
|---|---|---|---|
| 4,672,582 | 5/1985 | Nishimura | 365/201 |
| 4,879,690 | 11/1989 | Anami | 369/201 |
| 5,241,500 | 8/1993 | Barth | 365/201 |
| 5,416,741 | 5/1995 | Ohsawa | 365/230.03 |
| 5,475,635 | 12/1995 | Nogle | 365/189.02 |

*Primary Examiner*—A. Zarabian
*Attorney, Agent, or Firm*—Theodore E. Galanthay; Lisa K. Jorgenson; Renee M. Larson

[57] ABSTRACT

According to the present invention, a block of a static memory device, or some portion thereof, is selected to be subjected to a long write test. Choosing a portion of the static memory device, such as a block, offers the advantage of limiting current switching transients as well as recovery time following the long write test. All bitlines of the selected block are written to simultaneously for a period of time; all the wordlines within the selected block are disabled during this time so that no memory cell is selected. The bitlines of the selected block are recovered in two phases so that current switching transients are limited to a reasonable value and writing to the bitlines may be staggered. Finally, the selected block is read disturbed by cycling row fast through the selected block.

48 Claims, 2 Drawing Sheets

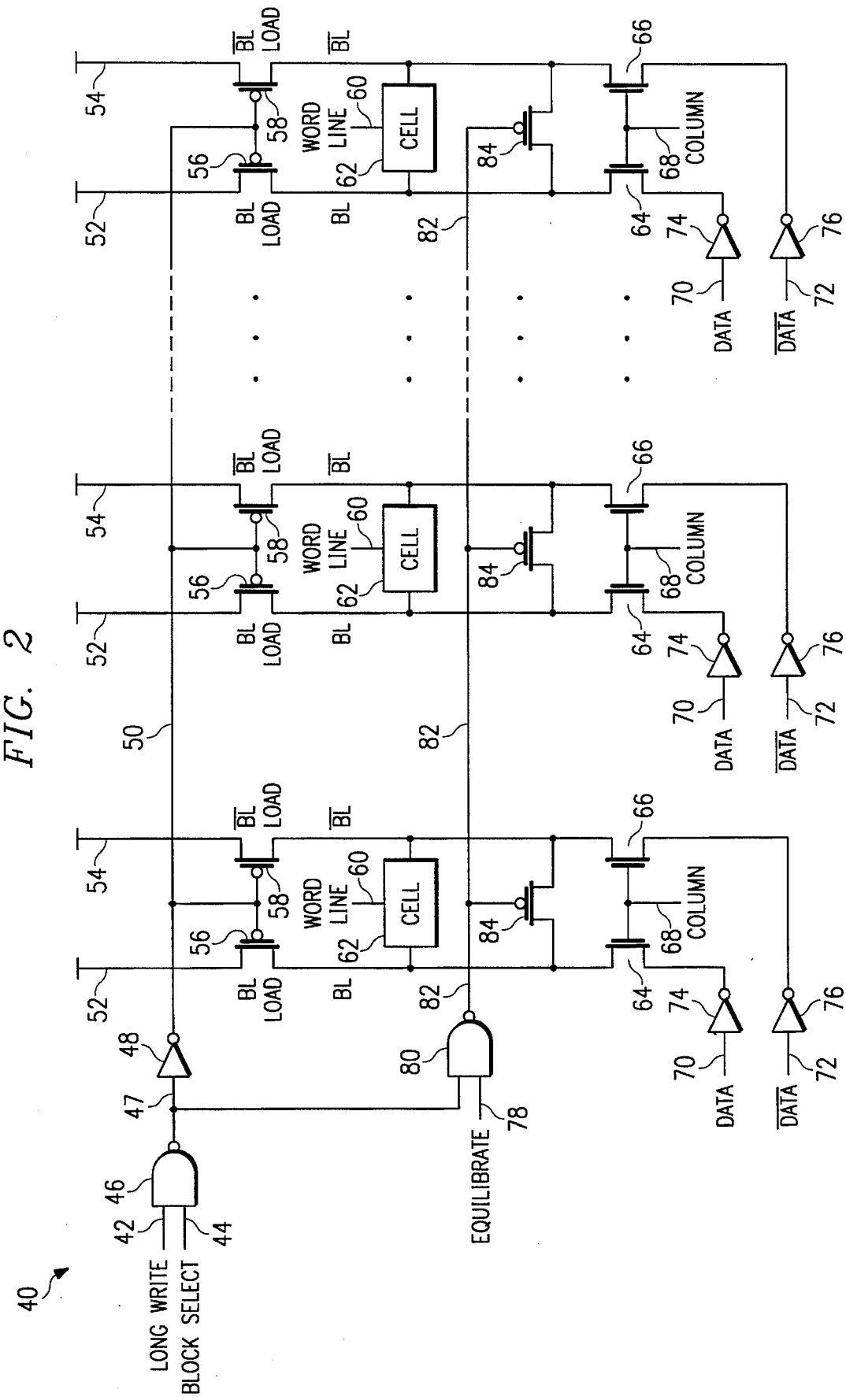

LONG WRITE TEST

CROSS REFERENCE TO RELATED APPLICATIONS

The subject matter of the present application is related to copending U. S. application, Ser. No. 08/173,197, titled "Improved Static Memory Long Write Test", filed Dec. 22, 1993, which is assigned to the assignee hereof and herein incorporated by reference.

BACKGROUND OF THE INVENTION

The present invention relates generally to static memory testing, and more specifically to long write testing of static memory devices.

Writing to a memory cell or cells of static memories, such as static random access memories (SRAMs), multiple port memories, and First In First Out (FIFO) memories, can sometimes adversely affect adjacent memory cells on the same column that share a bitline. These adjacent memory cells should not be affected if their wordlines are off; however, leakage from a memory cell node to a bitline may be sufficient to overcome the pull-up resistance of an adjacent non-selected memory cell, causing the data of that memory cell to become corrupted. This problem is exacerbated when memory cells are subjected to a long write cycle, because there is greater opportunity for such leakage to occur by virtue of the length of the write cycle. Therefore, memory cell node to bitline leakage and subsequent corruption of adjacent non-selected memory cells is often a concern during long write testing of a static memory.

Long write testing is typically conducted after writing a test data pattern to selected memory cells of a static memory. The leakage problem associated with a long write test occurs when writing to memory cells along a column and inadvertently affecting non-selected memory cells, whose wordlines are off. The non-selected memory cells that are affected experience leakage from the memory cell node to a bitline which causes them to erroneously change state. The write cycle during a long write test is typically quite long, thereby increasing the probability that the leakage problem will occur.

Unfortunately, the test modes which may be used to screen for bitline to cell leakage may introduce additional problems. Such test modes may themselves adversely affect the long write test by introducing large switching transients. For instance, after the wordlines of all memory cells of a static memory are turned off, a test mode may simultaneously pull down either bitline true or bitline complement of an entire memory in order to "disturb" the memory cells. The memory cells may then be read following the disturb condition to check for errors in the states of individual memory cells. However, the act of simultaneously pulling large numbers of bitlines to a given logic state necessarily introduces large current switching transients. Additionally, memory cell recovery time of disturbed memory cells following such stress testing may be of an undesirably long duration.

Thus, there exists an unmet need in the art to be able to perform a long write test in a manner that effectively identifies leakage problems while also minimizing long write test time, current switching transients, and memory cell recovery time.

SUMMARY OF THE INVENTION

It would be advantageous in the art to effectively and efficiently perform a long write test of a static memory device, thereby reducing the long write test time.

It would further be advantageous in the art to perform a long write test of a static memory device which effectively identifies memory cell bitline to cell leakage problems.

It would further be advantageous in the art to perform a long write test of a static memory device which minimizes current switching transients, thereby allowing for a more realistic long write test.

It would further be advantageous in the art to minimize disturbed memory cell recovery time following a long write test of a static memory device.

Therefore, according to the present invention, a block of a static memory device, or some portion thereof, is selected to be subjected to a long write test. Choosing a portion of the static memory device, such as a block, offers the advantage of limiting current switching transients as well as recovery time following the long write test. All the bitlines of the selected block are written to simultaneously for a period of time; all the wordlines within the selected block are disabled during this time so that no memory cell is selected. The bitlines of the selected block are recovered in two phases so that current switching transients are limited to a reasonable value and writing to the bitlines may be staggered. Finally, the selected block is read disturbed by cycling row fast through the selected block.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2 is a schematic diagram of selected block bitline control circuitry, according to the present invention;

DESCRIPTION OF THE INVENTION

The present invention describes an effective and efficient manner of testing a static memory device that effectively identifies leakage problems while also minimizing long write test time, current switching transients, and memory cell recovery time. A block of a static memory device, or some portion thereof, is selected to be subjected to a long write test, while other blocks or portions of the static memory device are not subjected to a long write test. All bitlines of the selected block are written to simultaneously for a period of time; all the wordlines within the selected block are disabled during this time so that no memory cell is actually disturbed. The bitlines of the selected block are recovered in two phases so that current switching transients are limited to a reasonable value and writing to the bitlines may be staggered. Finally, the selected block is read disturbed by cycling row fast through the selected block.

A block or similar portion of the memory array is selected to be subjected to a long write test, according to the present invention. For instance, an entire memory block may conveniently be chosen to be subjected to the long write test; for a 1 Meg static random access memory (SRAM), for instance, one block represents a sixteenth of the memory array. The advantage of choosing one memory block is that a sizable portion of the memory array may be tested while still limiting switching transients and the recovery time of disturbed memory cells within the selected block. All the bitlines within the selected block are written to simultaneously for more than approximately 1 µS after all the wordlines within the selected block are disabled such that no cell within the selected block is selected. The wordlines may be disabled any time prior to writing to the wordlines. Next, the bitlines of the selected block are recovered in two phases in order to limit the current switching transients to a reasonable value. Also staggering of writing and subsequent recovery of the bitlines from column to column is performed, as will be later described. Finally, the selected block is read disturbed by cycling row fast through the selected block. After 256 cycles, for instance, 256 wordlines will have been enabled and then disabled. This method of fast row cycling is sufficient to disturb an unstable memory cell by flipping the logic state of the memory cell within the selected block in a very time efficient manner.

Figure 1:
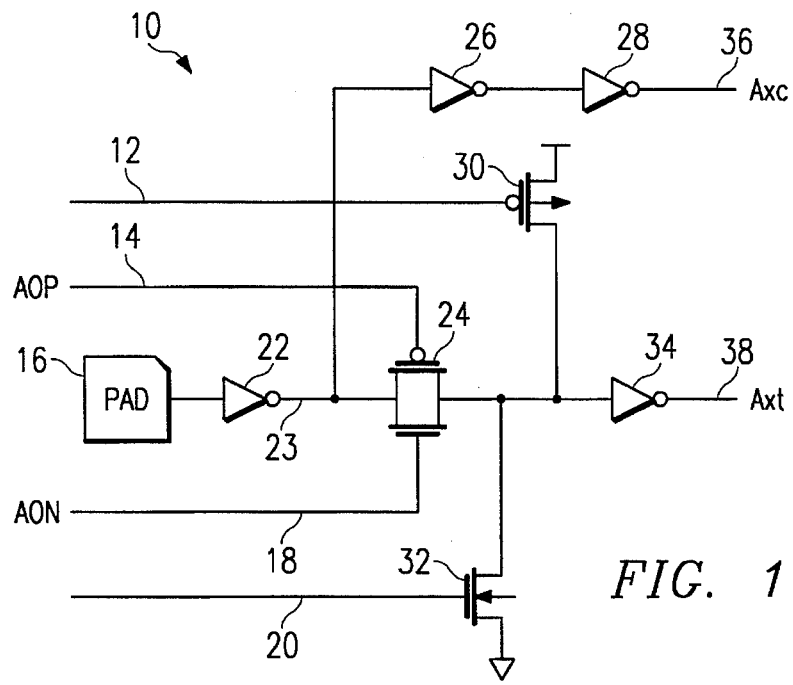
FIG. 1 is a schematic diagram of address buffer circuitry which is used to implement a long write test, according to the present invention.

Referring to FIG. 1, a schematic diagram of address buffer circuitry 10 which is used to implement such a long write test, according to the present invention, is shown. Address buffer circuitry 10 allows for the proper internal control of addresses necessary to perform the long write test. Address buffer circuitry 10 is a row address driver circuit and is comprised of the following components: address bond pad 16, inverters 22, 26, 28, 34, passgate 24, p-channel pull up transistor 30, and n-channel pull down transistor 32. The output signal 23 of inverter 22 is fed to the input of passgate 24, which is directly controlled by address override signal A0P 14 and address override signal A0N 18; address override signal A0P 14 and address override signal A0N 18 are inverse signals of each other. Additionally, passgate 24 may be indirectly controlled by signal 12 or signal 20. Signal 12 controls the gate of p-channel pull-up transistor 30, while signal 20 controls the gate of n-channel pull-down transistor 32. When signal 12 is a low logic level and passgate 24 is forced off (A0P high), address true signal Axt 38 is equal to a low logic level. When signal 20 is a high logic level and passgate 24 is forced off (A0P high), address true signal Axt 38 is a high logic level. Address complement signal Axc 36 is controlled by address bond pad signal 16.

Table 1 illustrates the modes of operation provided for by address buffer circuitry 10. When in test mode, address override signal A0P 14 and address override signal A0N 18 are a high logic level and low logic level, respectively.

TABLE 1

| Pad 16 | Signal 12 | Signal 20 | Axt | Axc | Comment |
|---|---|---|---|---|---|
| 0 | 1 | 0 | 0 | 1 | Normal operation:A0P=0,A0N = 1 |
| 1 | 1 | 0 | 1 | 0 | Normal operation:A0P=0,A0N = 1 |
| 1 | 0 | 0 | 0 | 0 | Test mode; A0P = 1; A0N = 0 Disabling condition for NAND type decoding |
| 0 | 1 | 1 | 1 | 1 | Test mode; A0P = 1; A0N = 0 Enabling condition for NAND type decoding |
| 1 | 1 | 1 | 1 | 0 | Test mode; A0P = 1; A0N = 0 Staggering condition |

As shown in Table 1, normal operation occurs when address override signal A0P 14 and address override signal A0N 18 are a low logic level and a high logic level, respectively. The test mode is defined when address override signal A0P 14 is equal to a high logic level and address override signal A0N 18 is equal to a low logic level. There are three possible test mode conditions defined in Table 1: a disabling condition, an enabling condition, and a staggering condition. The enabling condition and the disabling condition are with respect to NAND gate type decoding, where a high logic level signal, for instance, is required to decode an address. It is important to note that not all addresses are controlled the same when in the test mode. The emphasis is to keep switching transients at a minimum by toggling as few nodes simultaneously as possible. For instance, upon entering a long write test, the static memory device first enters the staggering condition and then transitions to the enabling condition. Conversely, the static memory device transitions from the enabling condition to the staggering condition before exiting the long write test. Therefore, both upon entering and exiting the long write test, switching transients are kept to a minimum by toggling as few nodes as possible. A description of how each type of address is handled in the test mode is shown in Table 2 below:

TABLE 2

| Address Type(# of placements) | Forced Condition | Effect of Forced Condition |
|---|---|---|
| Block left/right row (1X) | Enabling/Staggered | Write left and right side of block simultaneously |

TABLE 2-continued

| Address Type(# of placements) | Forced Condition | Effect of Forced Condition |
| --- | --- | --- |
| Row (7X) | Normal Operation | Limit switching transients |
| Even/Odd Row (1X) | Disabling | Turn off all wordlines; Limit switching transients |
| Block Column (4X) | Normal Operation | Define selected block |
| Column (4X) | Enabling/Staggered | Write to all bitlines in the selected block |

Note that, according to Table 2, address "jamming" or disabling is limited to only two row addresses and four column addresses for one block of a 1 Meg SRAM, such that switching transients are minimized. Thus, while these row addresses and column addresses are overridden, the other addresses are left in normal operating mode, not test mode. One row address is overridden in a disabling state to ensure that no wordlines are on.

When in the test mode, the bitline loads within the selected block are turned off, while all non-selected blocks' bitline loads remain on. Again, the current switching transients associated with switching off and on the bitline loads must be minimized; hence, only the selected block is affected. Referring to FIG. 2, a schematic diagram of selected block bitline control circuitry 40 which, according to the present invention determines that only the selected block is affected, is shown. A long write signal 42 and block select signal 44 are both inputs to NAND gate 46, the output signal of which is an input signal to inverter 48, as shown. The output signal of inverter 48 is bitline load control signal 50 which drives the gates of BL load and BL bar load transistors 56 and 58, respectively. Signal 47, the output signal of NAND gate 46, and Equilibrate signal 78 are the input signals to NAND gate 80. The output signal 82 of NAND gate 80 controls the gate of p-channel transistor equilibrate device 84 as shown.

Bitline (BL) 52 and bitline bar (BL bar) 54 form a bitline pair and are representative of all the bitlines and bitline pairs of the selected block. For ease of illustration, only three bitline pairs are shown in FIG. 2. Connected to bitline 52 and bitline bar 54, respectively, are bitline load (BL Load) 56 and bitline bar load (BL bar Load) 58. The gates of BL Load 56 and BL bar Load 58 are connected to each other as well as to bitline load control signal 50. Memory cell 62 is connected to a source/drain of both BL Load 56 and BL bar Load 58, as shown, and is controlled by Wordline 60. Memory cell 62 may be representative of a variety of memory cells known in the art, such as a Poly-R Load memory cell. Bitline true column passgate 64 and bitline complement column passgate 66 each have a gate which is connected to and controlled by column decode signal 68. A source/drain of passgate 64 is connected to write driver 74 which has Data signal 70 as its input signal, and a source/drain of passgate 66 is connected to write driver 76 which has Data complement signal 72 as its input signal. When long write test signal 42 and block select signal 44 are both a high logic level, BL load 56 and BL bar Load 58 are turned off; p-channel transistor equilibrate device 84 is also turned off.

Figure 3:
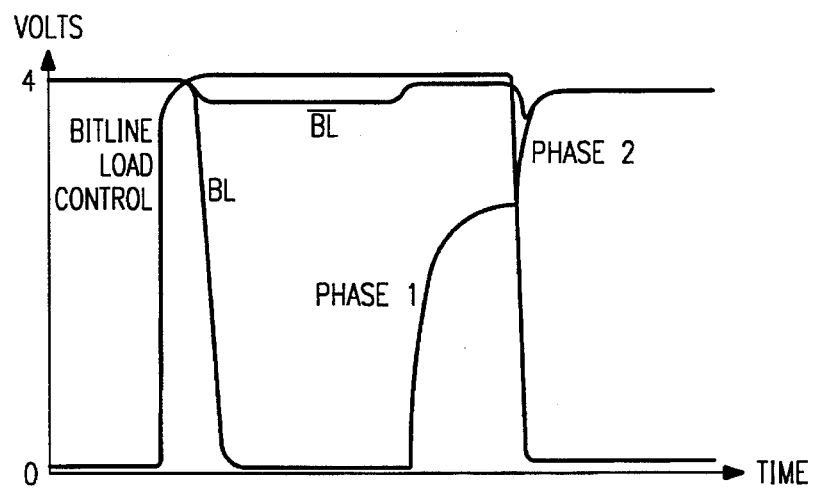
FIG. 3 is a graph of the two phase bitline recovery, according to the present invention.

After an appropriate amount of time, usually several microseconds or longer, the long write is terminated. Writing of the bitlines is accomplished by pulling at least Bitline 52, Bitline Bar 54, or both Bitline 52 and Bitline bar 54, to a low logic level. Bitline 52 and Bitline bar 54 may now be recovered using a two phase recovery method. In phase 1, the write drivers are allowed to recover Bitline 52 and Bitline bar 54 to a VCC-VTn logic level, and Data signal 70 and Data complement signal 72 are both a low logic level. As is well known in the art, Vcc is the power supply and VTn is the threshold voltage of n-channel transistors 64 and 66. For, even though the long write test is no longer writing, the device is still in the long write test mode. At this point, signal 82 is still disabled (forced to a high logic level) and will remain disabled until phase 2. After the device bitlines are stabilized at VCC-VTn, the long write test mode may be exited in phase 2. Bitline equilibration is disabled during a long write to avoid an equilibrate pulse being generated on the end of the write transition of phase 1. Once the long write test mode is exited, Bitline 52 and Bitline bar 54 are recovered to VCC through bitline pull-up devices, and signal 82 is allowed to go to a low logic level. Long write signal 42 is a low logic level. This two phase recovery method minimizes current switching transients, when compared with recovering the bitlines in only one transition. After the recovery, the selected block may be read disturbed. A graph of the two phase bitline recovery method is illustrated in FIG. 3.

Table 3 below summarizes the long write test timing of the present invention which has been described above:

TABLE 3 Long Write Test Timing

Step 1. Write test data pattern for a selected block.
Step 2. Disable device; enter long write test mode.
Step 3. Enable device; bring write low and perform long write.
Step 4. Bring write high; Phase 1—recover bitlines to VCC-VT.
Step 5. Disable device; exit long write test mode; Phase 2—recover bitlines to VCC.
Step 6. Enable block; perform read disturb row fast at minimum cycle time.
Step 7. Check for memory cell errors.
Repeat steps for additional blocks.

Even when the long write test is limited as described above to one selected block, the current switching transients may still be quite large. Again examining a 1 Meg SRAM, 256 columns of one selected block may be affected simultaneously, for instance. In order to further reduce such current switching transients associated with the long write test, the staggering condition defined in Table 1 may be utilized. Note that by switching the logic state of address bond pad signal 16 from a low logic state to a high logic state, address buffer circuitry 10 can go from an all enabling condition, where both address true signal Axt 38 and address complement signal Axc 36 are equal to a high logic level, to a "normal" operating mode where address true signal Axt 38 is a high logic level and address complement signal Axc 36 is a low logic level. Thus, by switching address bond pad signal 16 to a high logic level, only half, not all, of the bitlines of the block will be written at any given time.

Figure 4:
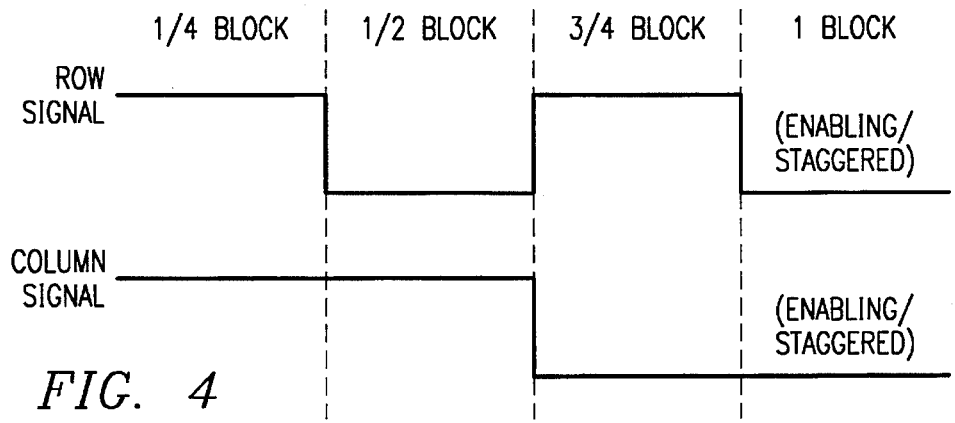
FIG. 4 is a timing diagram which illustrates the staggering condition, according to the present invention.

Address bond pad signal 16 may be switched to a high logic level at any time before writing to the bitlines of the selected block. Referring to FIG. 4, a timing diagram 80 which illustrates the staggering condition for a 1 Meg SRAM is illustrated. As shown, only one-fourth of the 256 columns of the selected block, or 64 columns, are pulled to a low logic level at any given time.

Additionally, the two phase bitline recovery sequence may be reversed such that only one-fourth of the selected block, for instance, is recovered at a time. This may be extended for the other enabling/staggered addresses of Table 2, such that if a normal binary count up/count down sequence is used, only eight columns (assuming an eight bit wide device) of the selected block would be charged or discharged at any given time. The obvious advantage of this is that current switching transients may be reduced to approximate those encountered during normal operating modes.

Currently, work is being done in the area of process technology with the hope of alleviating the bitline to memory cell leakage problem described in the Background of the Invention. How much potential process changes may affect future static memory technologies is unclear, and the success this research may produce remains to be seen. The problems associated with long write tests are difficult to identify unless specific tests which target the problems are performed. By performing the long write test according to the present invention, identification of faulty and unstable memory cells may be maximized.

The present invention provides the capability of achieving greater than a thirty-two fold improvement in long write test time of a 1 Meg SRAM, while incurring minimal transient switching current. Switching transients may be reduced by "jamming" only selected addresses appropriately, staggering the jamming of addresses, controlling the bitline loads of a selected block, and recovering the bitlines in two phases by making use of write drivers. Using these methods, current switching transients may be reduced to approximate those encountered in normal operating modes.

While the invention has been particularly shown and described with reference to a preferred embodiment, it will be understood by those skilled in the art that various changes in form and detail may be made therein without departing from the spirit and scope of the invention.

What is claimed is:

1. A method of performing long write testing of a static memory device, comprising the steps of:
   selecting a portion of a static memory device to subject to a long write test during a test mode, wherein the selected portion of the static memory device has a plurality of wordlines, a plurality of bitlines, and a plurality of address signals, including a plurality of row address signals and a plurality of column address signals;
   writing to the plurality of bitlines within the selected portion of the static memory device simultaneously for a predetermined period of time, thereby performing a long write test;
   recovering the plurality of bitlines within the selected portion of the static memory device; and
   read disturbing the selected portion of the static memory device.

2. The method of claim 1, wherein before the step of writing to the plurality of bitlines, comprising the additional step of:
   disabling the plurality of wordlines within the selected portion of the static memory array.

3. The method of claim 2, wherein only one row address signal of the plurality of row address signals is overridden in a disabling state to ensure that the plurality of wordlines within the selected portion of the static memory array are disabled.

4. The method of claim 1, wherein during the test mode only a subset of the plurality of address signals are overridden.

5. The method of claim 1, wherein the plurality of bitlines are recovered in a first phase and a second phase.

6. The method of claim 5, wherein in the first phase, the plurality of bitlines are recovered to a first predetermined logic level.

7. The method of claim 6, wherein the first predetermined logic level is equal to Vcc-VTn, wherein Vcc is a power supply of the static memory device and VTn is an n-channel transistor threshold voltage.

8. The method of claim 6, wherein the plurality of bitlines are recovered to the first predetermined logic level by a plurality of write drivers.

9. The method of claim 5, wherein in the second phase, the plurality of bitlines are recovered to a second predetermined logic level.

10. The method of claim 9, wherein the plurality of bitlines are recovered to the second predetermined logic level by a plurality of corresponding bitline loads.

11. The method of claim 9, wherein the second predetermined logic level is equal to Vcc, wherein Vcc is a power supply of the static memory device.

12. The method of claim 1, wherein read disturbing the selected portion of the static memory device is accomplished by fast row cycling through the selected portion of the static memory device.

13. The method of claim 12, wherein the static memory device is a 1 Meg static random access memory (SRAM), the selected portion of the 1 Meg SRAM is a block having 512 wordlines representative of one sixteenth of the 1 Meg SRAM, and after fast row cycling through the block, the 512 wordlines of the block have been enabled and disabled in a 512 cycles.

14. The method of claim 1, wherein the predetermined period of time for which the plurality of bitlines are written is more than approximately 1 µS.

15. The method of claim 1, wherein static memory device is a 1 Meg static random access memory (SRAM) and the selected portion is a block representative of one sixteenth of the 1 Meg SRAM.

16. The method of claim 1, wherein selecting the portion of the static memory device to subject to a long write test is accomplished when a block select signal generated by block select circuitry is equal to a predetermined logic level.

17. The method of claim 16, wherein during the test mode, the block select signal controls a plurality of bitline loads.

18. The method of claim 17, wherein equilibration of the plurality of bitlines is disabled during the test mode.

19. The method of claim 1, wherein before the step of writing to the plurality of bitlines, comprising the additional step of:
   switching an address signal of the plurality of address signals from a first logic state to a second logic state, such that only a portion of the plurality of bitlines is written to simultaneously.

20. The method of claim 19, wherein only one-half of the plurality of bitlines is written to simultaneously.

21. A method of performing long write testing of a static memory device, comprising the steps of:
   selecting a portion of a static memory device to subject to a long write test during a test mode, wherein the selected portion of the static memory device has a plurality of wordlines, a plurality of bitlines, and a plurality of address signals, including a plurality of row address signals and a plurality of column address signals;

switching an address signal of the plurality of address signals from a first logic state to a second logic state, such that only a portion of the plurality of bitlines is written to simultaneously;

writing to the plurality of bitlines within the selected portion of the static memory device simultaneously for a predetermined period of time, thereby performing a long write test;

recovering the plurality of bitlines within the selected portion of the static memory device; and read disturbing the selected portion of the static memory device, wherein when the address signal is equal to the first logic state, a true derivative signal of the address signal is equal to the first logic state and a complement derivative signal of the address signal is equal to the second logic state, thereby defining a staggering condition; when the address signal is equal to the second logic state, the true derivative signal and the complement derivative signal are both equal to the first logic state, thereby defining an enabling condition.

22. The method of claim 21, wherein upon entering the long write test, the static memory device first enters the staggering condition and then transitions to the enabling condition.

23. The method of claim 21, wherein the static memory device transitions from the enabling condition to the staggering condition before exiting the long write test.

24. A structure to perform long write testing of a static memory device, comprising:

a selected portion of a static memory device having a plurality of wordlines, a plurality of bitlines, and a plurality of address signals, including a plurality of row address signals and a plurality of column address signals; and an address buffer circuit which controls the plurality of address signals to perform the long write testing of the static memory device, wherein the address buffer circuit comprises:

an address bond pad having an address signal of the plurality of address signals;

a first inverting element having the address signal as an input terminal and producing an output signal that is inverted with respect to the address signal, wherein the output signal of the first inverting element is an address complement signal produced by the address buffer circuit;

a passgate, having the address complement signal as an input signal, controlled by a first address override signal and a second address override signal to selectively pass the address complement signal as an output signal, wherein when the first address override signal is a first logic level and the second address override signal is a second logic level, the selected portion of the static memory device is placed in a test mode;

a pull-up element, having a first terminal electrically connected to a first supply voltage and a second terminal electrically connected to the output signal of the passgate, controlled by a first control signal;

a pull-down element, having a first terminal electrically connected to the output signal of the passgate and a second terminal electrically connected to a second supply voltage, controlled by a second control signal;

a second inverting element, having an input terminal electrically connected to a node comprised of the output signal of the passgate, the second terminal of the pull-up element, and the first terminal of the pull-down element, which produces an address true signal of the address buffer circuit;

wherein the address complement signal is controlled by the address signal and the address true signal is controlled by the first control signal and the second control signal, such that when the first control signal is the second logic level the passgate is turned off and the address true signal is equal to the second logic level, and when the second control signal is the first logic level the passgate is turned off and the address true signal is equal to the first logic level.

25. The structure of claim 24, wherein the plurality of bitlines within the selected portion of the static memory device are written to simultaneously for a predetermined period of time, thereby defining a long write test of the selected portion of the static memory device, the plurality of bitlines within the selected portion of the static memory device are then recovered, and the selected portion of the static memory device is read disturbed.

26. The structure of claim 25, wherein before the plurality of bitlines within the selected portion of the static memory device are written to simultaneously for a predetermined period of time, the plurality of wordlines within the selected portion of the static memory array are disabled.

27. The structure of claim 26, wherein only one row address signal of the plurality of row address signals is overridden in a disabling state to ensure that the plurality of wordlines within the selected portion of the static memory array are disabled.

28. The structure of claim 25, wherein during the test mode only a subset of the plurality of address signals are overridden.

29. The structure of claim 25, wherein the plurality of bitlines are recovered in a first phase and a second phase.

30. The structure of claim 29, wherein in the first phase, the plurality of bitlines are recovered to a first predetermined logic level.

31. The structure of claim 30, wherein the first predetermined logic level is equal to Vcc-VTn, wherein Vcc is a power supply of the static memory device and VTn is an n-channel transistor threshold voltage.

32. The structure of claim 30, wherein the plurality of bitlines are recovered to the first predetermined logic level by a plurality of write drivers.

33. The structure of claim 29, wherein in the second phase, the plurality of bitlines are recovered to a second predetermined logic level.

34. The structure of claim 33, wherein the plurality of bitlines are recovered to the second predetermined logic level by a plurality of corresponding bitline loads.

35. The structure of claim 33, wherein the second predetermined logic level is equal to Vcc, wherein Vcc is a power supply of the static memory device.

36. The structure of claim 25, wherein the selected portion of the static memory device is read disturbed by fast row cycling through the selected portion of the static memory device.

37. The structure of claim 36, wherein the static memory device is a 1 Meg static random access memory (SRAM), the selected portion of the 1 Meg SRAM is a block having 512 wordlines representative of one sixteenth of the 1 Meg SRAM, and after fast row cycling through the block, the 512 wordlines of the block have been enabled and disabled in 512 cycles.

38. The structure of claim 25, wherein the predetermined period of time for which the plurality of bitlines are written is more than approximately 1 µS.

39. The structure of claim 25, wherein only a portion of the plurality of bitlines is written to simultaneously by switching the address signal from a first logic state to a second logic state.

40. The structure of claim 39, wherein only one-half of the plurality of bitlines is written to simultaneously.

41. The structure of claim 39, wherein when the address signal is equal to the first logic state, the address true signal of the address signal is equal to the first logic state and the address complement signal of the address signal is equal to the second logic state, thereby defining a staggering condition; when the address signal is equal to the second logic state, the address true signal and the address complement signal are both equal to the first logic state, thereby defining an enabling condition.

42. The structure of claim 41, wherein upon entering the long write test, the static memory device first enters the staggering condition and then transitions to the enabling condition.

43. The structure of claim 41, wherein the static memory device transitions from the enabling condition to the staggering condition before exiting the long write test.

44. The structure of claim 24, wherein static memory device is a 1 Meg static random access memory (SRAM) and the selected portion is a block representative of one sixteenth of the 1 Meg SRAM.

45. The structure of claim 24, wherein the portion of the static memory device is selected when a block select signal of a block select circuit is equal to a predetermined logic level.

46. The structure of claim 45, wherein during the test mode, the block select signal controls a plurality of bitline loads of the selected portion of the static memory device, wherein the plurality of bitline loads are electrically connected to the plurality of bitlines.

47. The structure of claim 46, wherein equilibration of the plurality of bitlines is disabled during the test mode.

48. The structure of claim 24, wherein the address buffer circuitry is a row address driver circuit.

* * * * *